United States Patent
Conway et al.

(10) Patent No.: US 8,962,997 B2
(45) Date of Patent: Feb. 24, 2015

(54) ELECTRICAL BOX

(71) Applicants: Raymond Leonard Conway, Milford, OH (US); Roddy M. Bullock, Milford, OH (US)

(72) Inventors: Raymond Leonard Conway, Milford, OH (US); Roddy M. Bullock, Milford, OH (US)

( * ) Notice: Subject to any disclaimer, the term of this patent is extended or adjusted under 35 U.S.C. 154(b) by 0 days.

(21) Appl. No.: 13/845,031

(22) Filed: Mar. 17, 2013

(65) Prior Publication Data

US 2014/0262416 A1    Sep. 18, 2014

(51) Int. Cl.
| H02G 3/08 | (2006.01) |
| H05K 5/02 | (2006.01) |
| H02G 3/16 | (2006.01) |

(52) U.S. Cl.
CPC ............. *H05K 5/0247* (2013.01); *H02G 3/16* (2013.01); *H02G 3/08* (2013.01)
USPC .................. 174/50; 174/53; 174/59; 174/481; 220/3.2; 220/3.3; 220/4.02

(58) Field of Classification Search
CPC ........... H02G 3/08; H02G 3/081; H02G 3/10; H02G 3/12; H02G 3/086; H02G 3/121; H02G 3/14; H02G 3/16; H05K 5/00; H05K 5/02; H05K 5/0217; H05K 5/03; H05K 5/0247; H01H 9/02
USPC ......... 174/480, 481, 50, 53, 57, 58, 559, 560, 174/66, 67, 520, 59; 220/3.2–3.9, 4.02, 220/241, 242; 439/535, 536
See application file for complete search history.

(56) References Cited

U.S. PATENT DOCUMENTS

| 5,216,203 | A | 6/1993 | Gower | |
| 5,378,174 | A * | 1/1995 | Brownlie et al. | 174/652 |
| 5,755,588 | A | 5/1998 | Sweatman | |
| 6,099,340 | A | 8/2000 | Florentine | |
| 6,184,461 | B1 * | 2/2001 | Flegel | 174/50 |
| 6,232,553 | B1 | 5/2001 | Regen | |
| 6,736,715 | B2 | 5/2004 | Kuhn | |
| 6,854,996 | B2 | 2/2005 | Yaworski et al. | |
| 7,037,128 | B2 | 5/2006 | Yaworski et al. | |
| 7,207,830 | B2 | 4/2007 | Conway | |
| 7,667,145 | B2 * | 2/2010 | Dinh et al. | 174/53 |
| 8,110,743 | B2 * | 2/2012 | Drane | 174/53 |
| 8,471,145 | B2 * | 6/2013 | Suzuki | 174/50 |
| 8,476,540 | B2 * | 7/2013 | Dahl et al. | 174/50 |
| 2004/0157488 | A1 | 8/2004 | Yaworski | |
| 2005/0092589 | A1 | 5/2005 | Conway | |
| 2005/0095927 | A1 | 5/2005 | Conway | |

FOREIGN PATENT DOCUMENTS

GB    20040157 A1    4/1993

* cited by examiner

*Primary Examiner* — Angel R Estrada (57) ABSTRACT

An electrical box suitable for safely and efficiently housing an electrical connection. The electrical box includes a bottom and a plurality of adjacent side walls, each side wall being at least partially joined to the bottom and to each adjacent side wall to form an open box. Each side wall has a top edge wherein the top edges define an open box perimeter. At least one side wall has at least one notch, the notch comprising deformable plastic members that can be biased in an open position to define a conductor opening to receive at least one of the electrical conductors. A top can be hingedly joined to one the top edges of one side wall and can be adapted to be moveable from an open position to a closed position. The conductor opening is at least partially defined by the top when the top is in the closed position, and the flexible flanges contact the conductors when the top is in the closed position.

18 Claims, 6 Drawing Sheets

ELECTRICAL BOX

This application claims priority to U.S. Provisional Application 61/614,461, entitled Electrical Box, filed Mar. 22, 2012.

FIELD OF THE INVENTION

The invention relates to electrical boxes for housing electrical connections.

BACKGROUND OF THE INVENTION

Electrical boxes for making safe and secure electrical connections are known. For example, metal or plastic boxes, often known as junction boxes, are often used to make connections of household wiring. Known boxes for this purpose often have predetermined openings in the sides that can be removed to permit entry of wiring to be connected. These openings may be formed by removing a portion of the side, so called "knock outs", or they may be made by deforming a portion of the box side to bend about a hinge line, thereby defining an opening in which wiring or cables can enter the box. Once the conductors to be connected have each entered the interior of the box via one or more of the predetermined openings, the connection can be made, the box cover placed on and secured, and the connection is complete.

One of the drawbacks with current boxes is the relative difficulty in facilitating entry of the conductors into the box. Often the portion of the side wall of the box to be removed must be knocked out with a tool such as a hammer. Often it must be pried out with a tool such as a screw driver. This can be especially difficult with metal boxes, for example.

Another drawback with current boxes is that the top, or lid, is easy to misplace, or forget when doing an electrical connection. For example, an electrician making connections in an attic may forget to bring along the top to a junction box, thereby necessitating an inconvenient and time-consuming trip out of the attic to retrieve the top.

Accordingly, there is a need for an electrical box, e.g., improved junction box, for making electrical connections that minimizes or eliminates the need to remember the top with each junction box.

Additionally, there is a need for an electrical box that is adapted to permit the making of electrical connections faster and easier within the box.

SUMMARY OF THE INVENTION

An electrical box suitable for safely and efficiently housing an electrical connection is disclosed. The electrical box includes a bottom and a plurality of adjacent side walls, each side wall being at least partially joined to the bottom and to each adjacent side wall to form an open box. Each side wall has a top edge wherein the top edges define an open box perimeter. At least one side wall has at least one notch, the notch comprising deformable plastic members that can be biased in an open position to define a conductor opening to receive at least one of the electrical conductors. A top can be hingedly joined to one the top edges of one side wall and can be adapted to be moveable from an open position to a closed position. The conductor opening is at least partially defined by the top when the top is in the closed position, and the flexible flanges contact the conductors when the top is in the closed position.

DETAILED DESCRIPTION OF THE INVENTION

Figure 1:
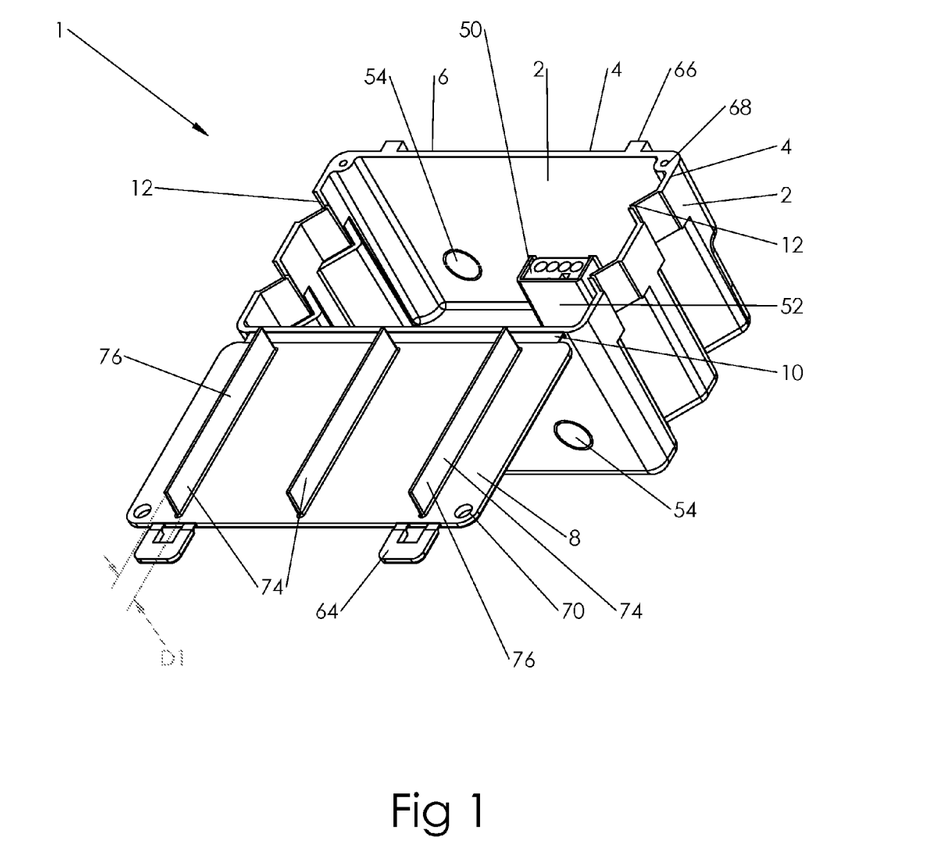
FIG. 1 is a perspective view of an embodiment of an electrical box of the present invention in a top open configuration.

One embodiment of an electrical box of the present invention is shown in FIG. 1. As shown, box 1 has side walls 2 joined to a bottom 3, which together form an open container. Although FIG. 1 shows a typical arrangement of four side walls 2 forming a rectangular box 1, the invention is not limited only to such a typical configuration. In general, any configuration of three or more side walls 2 will suffice. The top edges 4 of side walls 2 define a peripheral open edge 6 of the open container. Top 8 is hingedly joined at hinge 10 to one of the top edges 4, such that the top 8 can close shut, substantially sealing the container about the peripheral open edge 6. A notch, slit, or cut-out portion 12 of the top edge 4 of at least one side wall 2 defines an region of box 1 designed for a conductor opening, and which is adapted to receive at least one electrical conductor, cable, or the like. Boxes of the type shown in FIG. 1 can be referred to as junction boxes, and can be used, for example, in attics or walls of houses and other buildings.

In an embodiment, notch portion 12 is (as shown at 12 of FIG. 2), a slot extending generally vertically from a top edge 4 a distance sufficient to allow a conductor to be pressed between flexibly deformable plastic members 13, for example, a distance sufficient to allow a conductor to be pressed between them to a position below top edge 4. The length of the slot or notch portion 12 can, therefore, be any sufficient length, including a length of from about ¼ inch to about 2 inches, including every ⅛ inch increment in between for boxes 1 having interior volumes of about 25 to 35 cubic inches, such as boxes suitable for use in homes, wall, and attics. The above description describes and enables every ⅛ inch increment between ¼ inch and 2 inches, so that, for example, a distance of 1.5 inches is explicitly disclosed, described and enabled by the above range, because it is an increment of ⅛ inch between ¼ inch and 2 inches. Of course larger size and dimensions can be utilized for larger size boxes. Likewise, the width of notch portion 12 can be appropriately sized in widths ranging from about ⅛ inch to about 1 inch, including every ⅛ increment in between. Likewise, the length of slot or notch portion 12 can be from 10% to about 75%, or about 25% to about 60%, or about 35% to about 50% of the height of the side wall 2 on which it is disposed.

Figure 2:
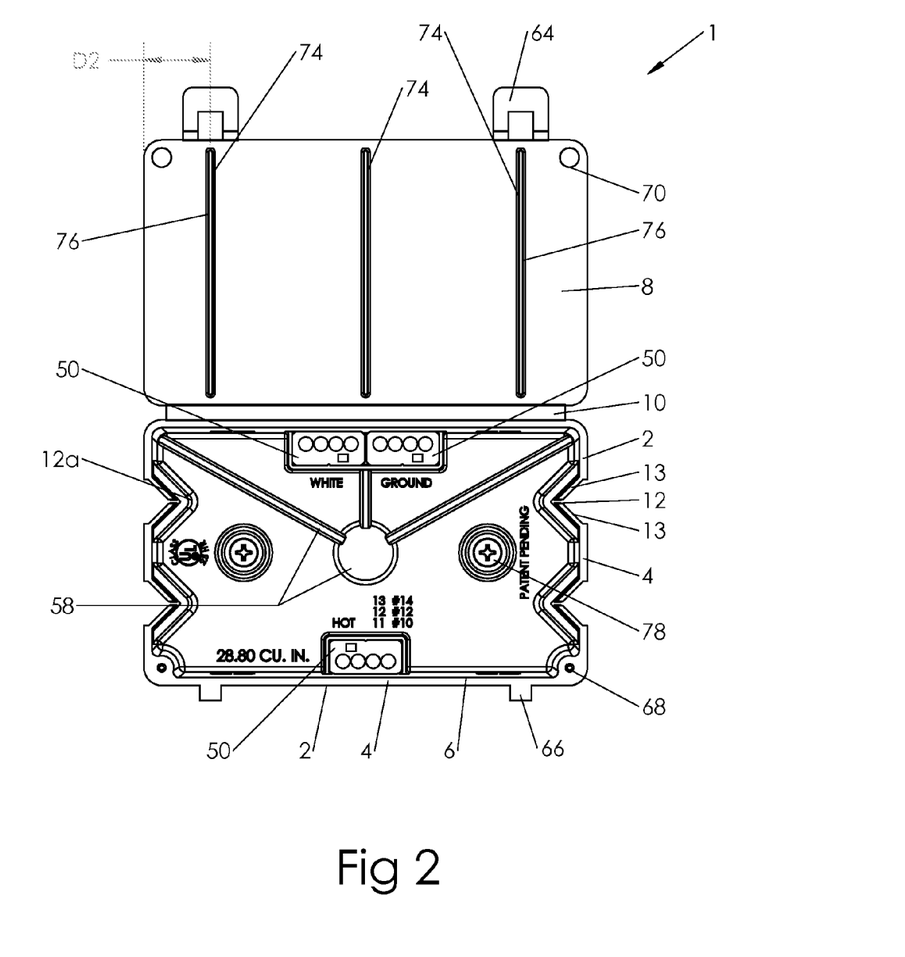
FIG. 2 is a top view of an embodiment of an embodiment of an electrical box of the present invention.

In an embodiment, notch portion 12 is (as shown at 12a of FIG. 2), a frangible portion of wall 2 that is designed with a thin wall capable of easily being broken or torn to form a slot extending generally vertically from a top edge 4 a distance sufficient to allow a conductor to be pressed between flexible plastic members a distance sufficient to allow a conductor to be pressed between flexible plastic members 13, for example, to a position below top edge 4 with all sizes and dimensions as described above for notch portion 12. In general, therefore, notch portion 12 can be in the form of a pre-formed slot or in the form of a thin-walled frangible portion that can be cut, broken, or otherwise fractured to form a slot for conductor insertion. In either configuration, flexible plastic members 13 serve to be hingedly or flexibly biased from a closed position as shown in FIG. 2, to an open position with conductors inserted therein. The plastic members 13 serve to press by torsional spring tension on the sides of conductors sufficiently to aid in holding conductors in place and act as a strain relief to help prevent conductors from being pulled out of box 1.

Thus, notch portions 12 can be described as being generally V-shaped (as viewed in top view) portions of side walls 2, wherein each "leg", or flexible flange, of the V is a flange that can be hingedly or flexibly biased from a closed position to an open position (either from an open slot configuration, or after breaking a thin-walled, frangible portion), which when in the open position the flexible plastic members 13 can tend to exert spring tension pressure upon conductors inserted in the notch portion opening.

Conductors can be individual, insulated copper wires, or they can be jacketed cables, in which multiple individually insulated wires are delivered to the box in a single cable having overall an overall insulated jacket. In one embodiment, connectors can form an embodiment of the invention. A connection can be made inside the box in any known manner, including by two connecting two or more conductors joined by a typical WIRE-NUT® wire connector, and the top closed such that the connection is safely and efficiently housed within box 1.

In an embodiment, connections inside box 1 can be made utilizing installed push-in connectors 50, such as push-in connectors marketed as IN-SURE® push-in wire connectors marketed by Ideal Industries, Inc. Push-in connectors 50 can be installed in any known manner, including pressing, gluing, screwing, or otherwise connecting to a bottom or sidewall of box 1, or, as shown in FIG. 1, and can be fitted, such as by press or snap fit, into a pre-formed pocket 52 sized to securely hold the push-in connector. In an embodiment, as shown in FIG. 2, a connector, such as a push-in connector, for the "hot" wires can be located on one wall, and the "neutral" (white) and/or "ground" wires can be located on a different wall, such as an opposite wall. In this manner, hot wires are separated from neutral and ground wires inside box 1.

In another embodiment, connections can be made by utilizing an insulated polymer strip, as is known in the art and exemplified by the design of CHOCBOX® electrical box, as shown in the brochure available at http://www.chocbox.info/images/chocbox_www_pdf.pdf.

Although FIG. 1 shows four notches 12, two on each of two opposing side walls 2, there could be more, and only one is necessary for the present invention. For example, both conductors to be connected can be placed into the box 1 via one notch 12 and still enjoy the advantages of the present invention. Likewise, although the notches 12 are shown in FIG. 1 as being substantially rectangular in shape from a side view, and have two flange-like plastic members 13 forming a V-shape from a top view, the shape is not determinant of the invention. For example, the shape of notches 12 for conductor openings can be practically any geometric shape, and can be shaped to fit specific cross-sectional sizes of specific conductors. Further, it is contemplated that the notches 12 of the present invention can be fitted with suitable grommets or pliable seals to provide a weatherproof fitting at the conductor openings, as well as providing for some strain relief on the conductors.

As can be seen in FIG. 2, side walls 2 comprising notches 12 are shaped with a generally V-shaped configuration in the region of notches 12 (as viewed from above, as in FIG. 2). The generally V-shape could be any non-linear indentation and serves to proved additional strength to side walls 2 when conductors are being pushed into slots of notches 12. Additionally, as seen in FIG. 2, multiple push-in connectors 50 can be utilized, including one connector each for hot wires, white wires, and ground wires. As shown in FIG. 2, in an embodiment, the connectors for hot and white/ground wires are separated, such as being disposed on opposite sides of box 1, so as to minimize the chances of inadvertent touching of hot wires to neutral or ground wires.

Figure 3:
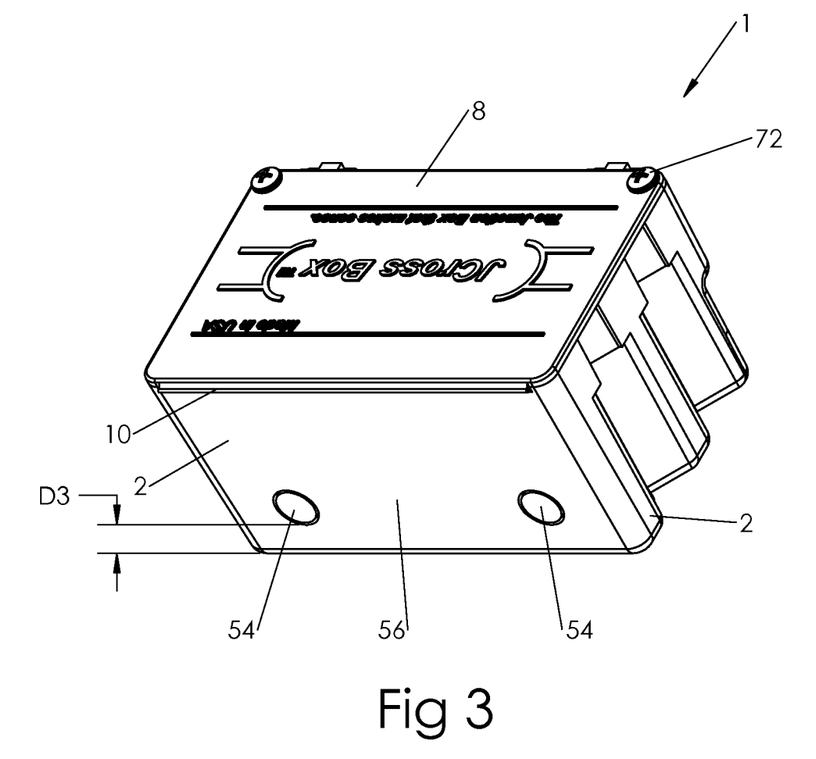
FIG. 3 is a perspective view of an embodiment of an electrical box of the present invention in a top closed configuration.

As shown in FIGS. 1-3, box 1 can have provided regions for "knock outs", which, as is known in the art, are portions of the box 1 that can be removed, leaving an opening suitable for receiving and connecting to conduit. As shown, for example, knock outs 54 can be formed by molding in thinned regions in the form of a circle, the thinned regions being relatively easily broken, allowing the central, circular (or other shape) piece of the side wall to be removed, leaving a circular opening in box 1 side wall 2. In addition to traditional knock outs, box 1 can be provided with a "dimple" or other depression 56 in sidewall 2, the dimple or depression serving to be a drill point guide aiding in drilling a hole in side of box 1. The drilled hole can then be used, for example, for connecting conduit to box 1. In general, knock outs 54 can be located having a lower edge a distance D3 from the bottom 3 of box 1, with the D3 being from about 1/16 inch to about 1/4 inch. The distance D3 permits conduits to be brought in at a level substantially equal to the distance the conduits are from a supporting structure, due to the clips or brackets holding the conduit onto the supporting structure. For example, a clip attaching a conduit to an attic rafter can displace the conduit a distance of about 1/4 inch from the rafter. A knock out similarly displaced permits a conduit to enter box 1 to enter straight into box 1.

Top 8 can be a separate member attached by any suitable means, including snaps, clips, and screws. Top 8 can also attached by a hinge connection to one of side walls 2. For example, top 8 can be joined by a "piano" hinge. However, in a preferred embodiment, as shown in FIGS. 1-3, top 8 is integral with a side wall 2 to which it is joined. In a preferred embodiment, the bottom 3, side walls 2, and top 8 are molded of plastic polymeric material, including impact resistant plastic material, as a unitary structure, with hinge 10 being a living hinge. As such, the electrical box 1 of the present invention can be substantially molded in one piece, in a single mold. The box 1 can be molded by methods known in the art for producing molded articles such as injection molding, utilizing, for example a port and runners 58 as shown in FIG. 1.

Top 8 can be retained in the closed position by means known in the art. For example, top 8 can be held closed by any number of known snap connections 60, screw connections 62, or simply by friction and force fit. Snap connection 60, for example, can use a bendable tab and hook engagement as shown in FIGS. 1 and 2, showing tab 64 and hook 66. When closed, tab 64 can be folded down and over hook 66 for a snap, or friction, fit. Alternatively, or in combination, as shown in FIGS. 1-3, a screw connection 62 can be achieved by providing at least one screw hole 68 in the body of box 1 and a corresponding screw hole 70 in top 8, such that when lid is closed, a screw 72 can be screwed, such as by threading into hole 68 for tightening top 8 to box 1 body.

Top 8 can have one or more flanges 74 extending generally perpendicularly from the bottom side of top 8, as shown in FIGS. 1 and 2. Flanges 74 can serve to add structural rigidity to top 8. But outer flanges 74, denoted as 76 in FIGS. 1 and 2 can serve an additional, primary function, which is to press down on and provide stability to conductors entering box through notches 12 when top 8 is closed. As can be appreciated from FIGS. 1 and 2, flanges 76 extend generally orthogonal to conductors entering box 1, and can extend a distance outwardly from bottom surface of top 8 to contact and press on conductors when top 8 is closed. Flanges 76 can be relatively flexible to bend, or, in a sense, buckle, under compressive pressure upon contact with conductors, so that the pressure tends to aid in stabilizing conductors entering box 1.

Thus, in an embodiment, flanges 76 can be relatively thin strips joined to, or molded integrally with, top 8 and which extend generally perpendicularly outwardly from the bottom of top 8 a distance D1 of between about ¼ inch and 2 inch, the longest dimension which can correspond to the depth of slot in notch 12. Flanges 76 are situated inwardly from the side edge of top 8 a distance D2 of from about ¼ inch to about 2 inch, depending on the type and size of conductors entering box 1. As with respect to the description of notches above, the range of dimensions here is hereby disclosed to describe and enable dimensions of every ⅛ inch increment between ¼ inch and 2 inches, such that, for example, a dimension of 1.5 inches is explicitly disclosed herein for the above dimensions.

As can be appreciated by the skilled person, the advantages of the present invention are many. For example, since prior to closing the top 8 conductor notch 12 is partially defined by the top edge 4 of side wall 2, the conductor to be connected can enter the box across the top edge 4 of side wall 2. That is, there is no need to feed the conductor(s) through a hole in the side of the box before making an electrical connection, but the conductors can simply be "laid in" so to speak, through the top of open notch 12. This greatly simplifies the job of making electrical connections. In fact, connections can be made prior to putting the connected conductor ends into the box. This permits an electrician, for example, to make connections in the open, then fit them into what can be a relatively confined area of the electrical box 1. Flanges 76 then aid in holding conductors in place once top 8 is closed.

Another advantage of the present invention is the presence of built-in connectors, such as the push-in connector blocks. Such connectors or connector blocks permit quick and easy connections to be made without the need for additional connector parts. For example, wires can be stripped, and the exposed conductors can be screwed or clamped in the connector blocks.

Another advantage of the electrical box 1 of the present invention is the hingedly joined top 8. By being joined hingedly, top 8 is essentially one piece with electrical box 1, so that the top 8 is always with box 1 and does not get lost or misplaced. This can save much time and effort, for example when an electrician is working in the attic of a house making electrical connections. He or she need not remember to carry multiple parts to make a safe, complete connection. The hingedly-joined top 8 is particularly beneficial when hinge 10 is a living hinge, as this greatly simplifies production of the box 1. As is known in the art, a living hinge is integrally molded with the parts to be hinged together, the hinge simply being a thinned portion of the molded article. When a living hinge is utilized, therefore, box 1 can simply be molded by known means a one piece, with an integrally-hinged top. Various mounting means, such as screw holes, nail guides, brackets and the like, as are known in the art for mounting to joists and the like, can be utilized with box 1. As shown in FIG. 1, screws 78 can extend through screw holes in box 1 for mounting purposes.

Figure 4:
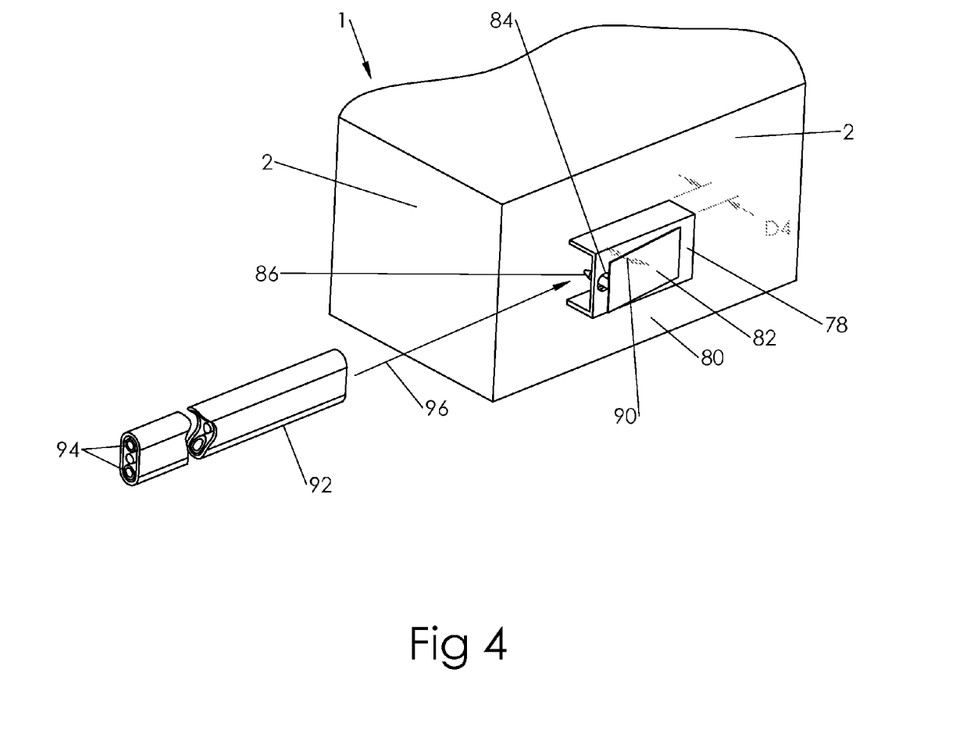
FIG. 4 is a partial perspective view of an embodiment of an electrical box of the present invention.
Figure 5:
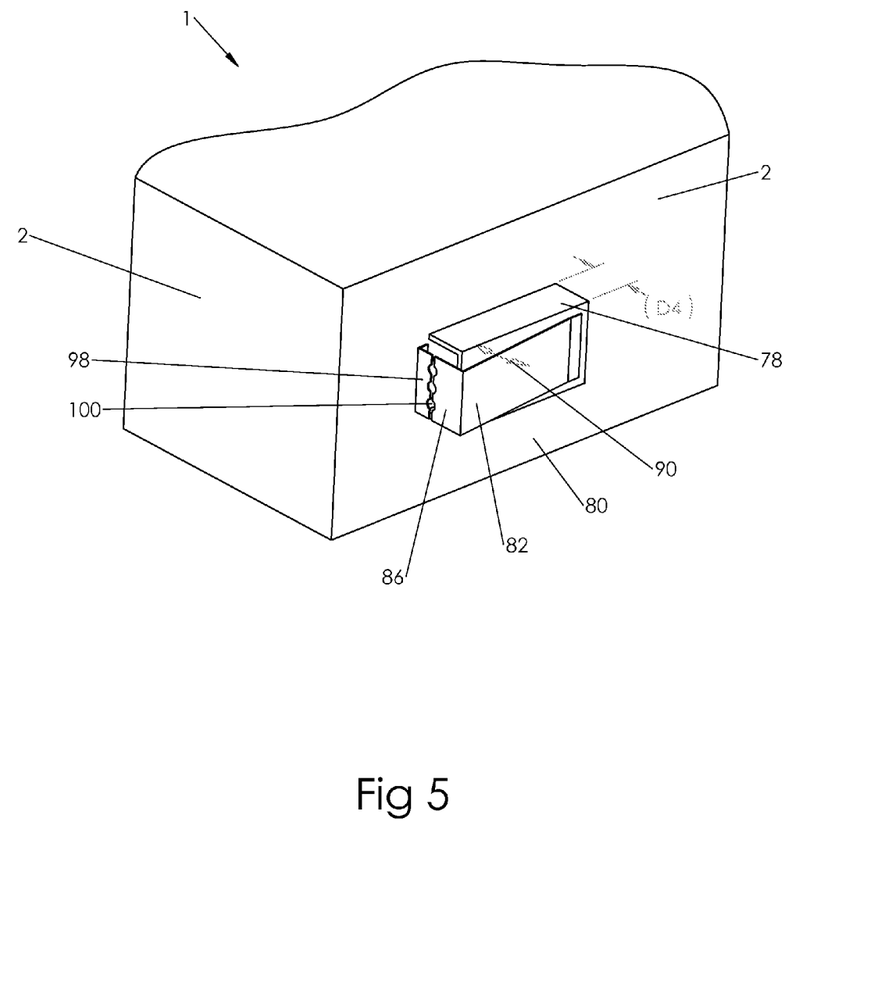
FIG. 5 is a partial perspective view of an embodiment of an electrical box of the present invention.
Figure 6:
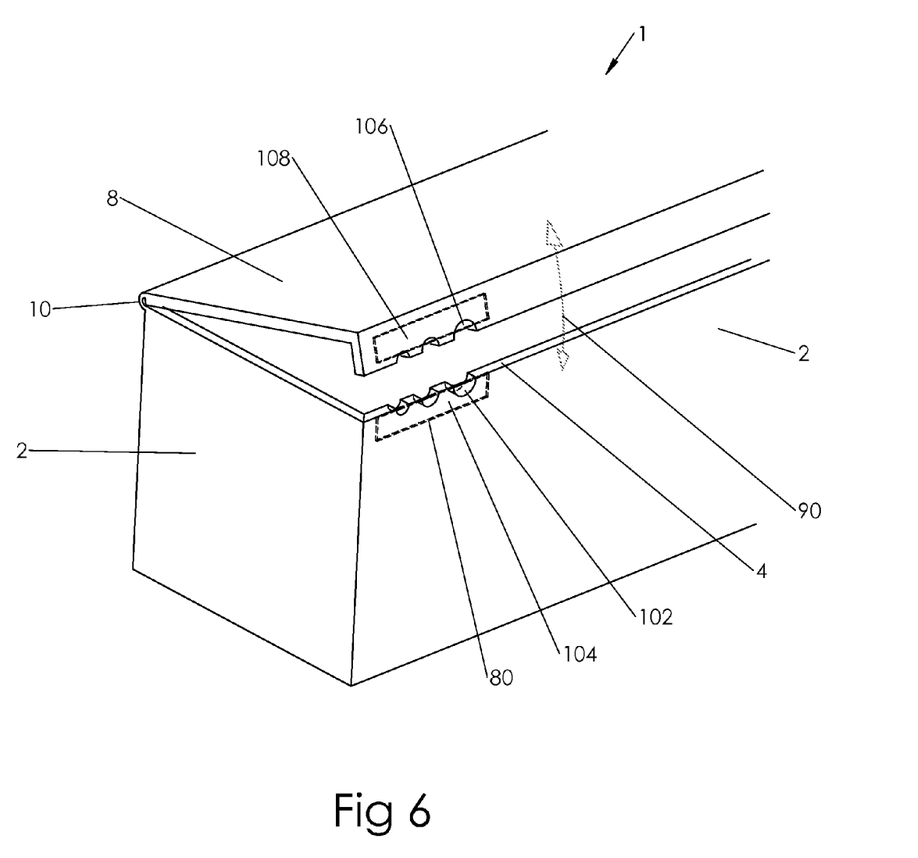
FIG. 6 is a partial perspective view of an embodiment of an electrical box of the present invention.

Often an electrician or other user of box 1 desires to strip wires for connection inside box 1. In an embodiment, as shown in FIGS. 4-6, box 1 can have incorporated in or on it a wire stripping member. For example, in FIG. 4, wire stripping member 80 is shown as a channel 78 having a depth D4 sufficient to permit a wire or cable, such as multi-conductor cable 92 to enter between the walls of channel 78 and wall 2 of box 1. Cable 92 can be, for example, ROMEX® brand of Non-Metallic Building Wire ("NM"). Wire stripping member 80 can have attached thereto a spring member 82 which can pivotally spring as indicated by arrow 90 so that stripping blade or tooth 86 can be depressed toward wall 2, for example, by the user's thumb. Cable 92, which can have inside it insulated conductors 94, can be inserted by moving it in the direction of arrow 96 until the length of cable jacket or insulation to be stripped off is inside channel 78. Spring member 82 can then be depressed so that blade or tooth 86 penetrates the jacket or insulation a sufficient depth without cutting or otherwise damaging any insulated conductors inside. Then the user can pull cable 92 out of channel 78, upon which motion blade or tooth 86 can slit the jacket or insulation to the end, at which time the user merely pulls back the slit jacket or insulation and removes it in a conventional manner. The size, shape, limits of motion, tooth (or blade) length, etc., of the wire stripping member 80 shown in FIG. 4 can be made as desired for the type and size of cables or wires to be stripped.

FIG. 5 shows a wire stripping member 80 similar to that shown in FIG. 4. The wire stripper shown in FIG. 5 is designed to strip individual insulated conductors. As shown, a channel 78 having a depth D4 sufficient to permit a wire or cable to enter between the walls of channel 78 and wall 2 of box 1. Wire stripping member 80 can have attached thereto a spring member 82 which can pivotally spring as indicated by arrow 90 so that stripping blade 86 can be depressed toward wall 2, for example, by the user's thumb. In the embodiment shown in FIG. 5, a mating stripping element 98 is positioned to be operationally aligned with stripping blade 86, such than when spring member is depressed, stripping blade and stripping element 98 meet to form one or more openings 100 which can be sized to match a standard conductor size, such that stripping blade 86 and stripping element 98, which can also be blade-like, cut through the insulation of a conductor to be stripped. To use, the user selects a right-size opening 100 for the particular conductor to be stripped, inserts an end of the conductor through the separated blades at the appropriate opening, pushes the spring member 82 toward box wall 2 as indicated by arrow 90 to cut through the insulation. The user can then pull the conductor back to pull off the "slug" of insulation from the end of the conductor. The size, shape, limits of motion, blade length, etc., of the wire stripping member 80 shown in FIG. 5 can be made as desired for the type and size of cables or wires to be stripped.

For each of the wire stripping members 80 shown in FIGS. 4 and 5, the placement, materials, and general design can be modified as necessary. For example, in an embodiment spring 82 or stripping element 98 can be made of flexible plastic or steel, with a sharpened edge on a portion intended to cut into wire insulation. Because the stripping member can be intended for use only for the connections inside a single box, there is no need for the blades, flexible materials, or other elements to be highly durable. Moreover, the entire stripping member 80 can be made to be attachable, frangibly removable, or otherwise removable such that upon final connections of all electrical connections, the user can snap off, break off, unscrew, or otherwise remove stripping element 80 from box 1.

Another version of a stripping member 80 is shown in FIG. 6, a version which takes advantage of a hinged top 8 which already can be pivotally moved from a from an open to closed position to facilitate wire stripping. As shown, a top edge 4 of a wall 2 can have along a portion thereof one or more generally round notches 102 placed to be in a mating relationship with similar notches 106 in a portion of top 8. A sharp or sharpened edge, such as a metal blade, can be formed inside each notch 102 and/or 106, such as by embedding a metallic blade 104 or 108 inside plastic wall 2 and/or top 8, respectively, such that, as shown in FIG. 6, a portion of metallic blade(s) is exposed in each notch 102 or 106. As can be understood from general wire stripping techniques, an end of a wire can be placed an appropriate distance over edge 4 in alignment with an appropriately sized notch 102. Top 8 can then be forced closed, thereby trapping a wire in the opening formed by notches 102 and 106, and, simultaneously, causing blade 104 and/or 106 to cut through the insulation of the wire. The wire can then be pulled back, or twisted and pulled back, to remove the "slug" of insulation from the end thereof.

In general, any of known wire strippers and techniques can be modified as necessary to be joined to, attached, or formed with, box 1. Therefore, in an embodiment, the invention can be described with or without all the features described above with respect to FIGS. 1-3, as an electrical box having disposed thereon, which can include attached to, joined to, formed with, etc., a wire stripping member. The wire stripping member can have a metal blade associated therewith. The wire stripping tool can have a pivotally hinged member, such as a spring member, that can be pressed, depressed, or otherwise moved from a first open position to a second cutting position (as described above with respect to FIGS. 4-6). In the second cutting position, a portion of the stripping member penetrates, such as by cutting, through at least a portion of the insulation of a wire or cable, such that after cutting the user need only pull, or twist and pull, the wire or cable to remove the insulation.

Other known variations can be made to an electrical box 1 of the present invention without departing from the scope of the invention. For example, strain relief clamps can be positioned appropriately so as to provide for strain relief on the cables. In one embodiment, screw-down strain relief clamps as known in the art can be molded or otherwise joined to the outside of box 1 such that once the conductors are connected in the box 1, the clamps are screwed tight to secure the conductors from undesirable tension on the connection. In general, therefore, any of known modifications to current electrical or junction boxes can be made to the box of the present invention.

We claim:

1. An electrical box suitable for safely and efficiently housing an electrical connection, the electrical connection being made between at least two electrical conductors, said electrical box comprising:
   a bottom;
   a plurality of adjacent side walls, each said side wall being at least partially joined to said bottom and to each adjacent side wall to form an open box, each said side wall having a top edge wherein the top edges define an open box perimeter;
   at least one said side wall comprising at least one notch, said notch comprising deformable plastic members that can be biased in an open position to define a conductor opening to receive at least one of the electrical conductors, said notch being in the form of a longitudinally extending slot having a length of less than about 1.5 inches;
   a top hingedly joined to one said top edge of one said side wall and adapted to be moveable from an open position to a closed position, the top further comprising flanges extending perpendicularly from a bottom side thereof, said flanges extending a distance from said bottom side to about 1.5 inches; and
   wherein said conductor opening is at least partially defined by said top when said top is in said closed position, and said flanges contact said conductors when said top is in said closed position.

2. The electrical box of claim 1, wherein said top is unitary with one of said top edges of said side wall.

3. The electrical box of claim 1, wherein said top is hingedly joined by a living hinge.

4. The electrical box of claim 1, wherein said notch comprises flexible flanges disposed in a V-shape.

5. The electrical box of claim 1, wherein at least one said side wall comprises a pocket capable of having inserted therein a connector block.

6. The electrical box of claim 1, wherein said box comprises at least one push-in connector, said push-in connector being disposed on at least one side wall of said box.

7. An electrical box suitable for safely and efficiently housing an electrical connection, the electrical connection being made between at least two electrical conductors, said electrical box comprising: a bottom; a plurality of adjacent side walls, each said side wall being at least partially joined to said bottom and to each adjacent side wall to form an open box, each said side wall having a top edge wherein the top edges define an open box perimeter; at least one said side wall comprising at least one notch, said notch comprising deformable plastic members that can be biased in an open position to define a conductor opening to receive at least one of the electrical conductors; at least one said side wall comprising a pocket capable of having inserted therein a connector block; a top hingedly joined to one said top edge of one said side wall and adapted to be moveable from an open position to a closed position; wherein said conductor opening is at least partially defined by said top when said top is in said closed position; wherein said notch is in the form of a longitudinally extending slot having a length of less than about 2 inches; and wherein said to further comprises flexible flanges extending perpendicularly from a bottom side thereof, said flanges extending a distance from said bottom side up to about 2 inches.

8. The electrical box of claim 7, wherein said top is unitary with said top edge of said side wall.

9. The electrical box of claim 7, wherein said top is hingedly joined by a living hinge.

10. The electrical box of claim 7, wherein at least one said side wall comprises a pocket capable of having inserted therein a connector block.

11. The electrical box of claim 7, wherein said box comprises at least on push-in connector, said push-in connector being disposed on at least one side wall of said box.

12. An electrical box suitable for safely and efficiently housing an electrical connection, the electrical connection being made between at least two electrical conductors, said electrical box comprising:
   a bottom;
   a plurality of adjacent side walls, each said side wall being at least partially joined to said bottom and to each adjacent side wall to form an open box, each said side wall having a top edge wherein the top edges define an open box perimeter;
   at least one said side wall comprising at least one notch, said notch comprising deformable plastic members that can be biased in an open position to define a conductor opening to receive at least one of the electrical conductors, said notch being in the form of a longitudinally extending slot having a length of less than about 1.5 inches;
   at least one said side wall comprising a pocket capable of having inserted therein a connector block;

a top hingedly joined to one said top edge of one said side wall and adapted to be moveable from an open position to a closed position, the top further comprising flanges extending perpendicularly from a bottom side thereof, said flanges extending a distance from said bottom side up to about 1.5 inches;

wherein said conductor opening is at least partially defined by said top when said top is in said closed position, and said flanges contact said conductors when said top is in said closed position.

13. The electrical box of claim 12, wherein said notch comprises two relatively flexible flanges disposed such that their distal ends define a slot through which conductors can be inserted.

14. The electrical box of claim 13, wherein said relatively flexible flanges are biased to a closed position such that when conductors are inserted through said slot, said flanges exert torsional spring forces on said conductors.

15. The electrical box of claim 12, wherein said notch comprises frangible portions separable along a thinned section.

16. The electrical box of claim 12, wherein at least one said side wall comprises a pocket capable of having inserted therein a connector block.

17. The electrical box of claim 12, wherein said box comprises at least on push-in connector, said push-in connector being disposed on at least one side wall of said box.

18. The electrical box of claim 12, comprising three push-in connector blocks, one each for hot, neutral, and ground wires.

* * * * *

UNITED STATES PATENT AND TRADEMARK OFFICE
CERTIFICATE OF CORRECTION

| | | |
|---|---|---|
| PATENT NO. | : 8,962,997 B2 | Page 1 of 1 |
| APPLICATION NO. | : 13/845031 | |
| DATED | : February 24, 2015 | |
| INVENTOR(S) | : Raymond Leonard Conway | |

It is certified that error appears in the above-identified patent and that said Letters Patent is hereby corrected as shown below:

Title page, item 72 should read as follows:

The correct inventorship should reflect Raymond Leonard Conway as the sole inventor.

Signed and Sealed this

Thirteenth Day of October, 2015

Michelle K. Lee
*Director of the United States Patent and Trademark Office*